United States Patent [19]

Pasch

[11] Patent Number: 4,708,770

[45] Date of Patent: Nov. 24, 1987

[54] PLANARIZED PROCESS FOR FORMING VIAS IN SILICON WAFERS

[75] Inventor: Nicholas F. Pasch, Mountain View, Calif.

[73] Assignee: LSI Logic Corporation, Santa Clara, Calif.

[21] Appl. No.: 876,019

[22] Filed: Jun. 19, 1986

[51] Int. Cl.[4] .................. C03C 15/00; C23F 1/02; H01L 21/312

[52] U.S. Cl. ................... 156/662; 156/656; 156/657; 156/659.1

[58] Field of Search ............ 156/630, 632, 662, 656, 156/657, 659.1

[56] References Cited

U.S. PATENT DOCUMENTS 3,784,424  1/1974  Chang .................... 156/662
4,305,760  12/1981 Trudel ................... 156/657
4,381,967  5/1983  Sanders et al. .......... 156/657
4,451,326  5/1984  Gwozdz ................. 156/657
4,635,347  1/1987  Lien et al. ............. 156/657

Primary Examiner—Kenneth M. Schor
Assistant Examiner—Lori-Ann Cody
Attorney, Agent, or Firm—Nathan N. Kallman; Alan H. MacPherson; Paul J. Winters

[57] ABSTRACT

A process for forming vias in semiconductor structures includes the step of forming a pillar on an underlying dielectric layer prior to deposition of the metallization layer. The pillar is located above the diffusion region preferably and serves to provide substantially equal distances or heights for etching vias from the top planarized surface to the metallization layer deposited over the field oxide region and over the diffusion region.

7 Claims, 11 Drawing Figures

PLANARIZED PROCESS FOR FORMING VIAS IN SILICON WAFERS

BACKGROUND OF THE INVENTION

1. Field of the Invention

This invention relates to a process of forming vias in semiconductor structures and in particular to an improved process of forming vias in planarized silicon wafers.

2. Description of the Prior Art

During the manufacture of semiconductor devices, such as transistors and integrated circuits, it has been found necessary to effectuate a planarization or a smoothing of the topography of an underlying surface of the structure that is being processed, prior to formation of the vias which enable the electrical connections from the metallization layer. The vias or bonding pads are preferably formed at the locations where the dielectric layer has the largest thicknesses. The semiconductor structure is typically characterized by two distinct areas generally referred to as the field oxide region (FOX) and the diffusion region. However, as a result of the fabrication steps employed in conventional prior art processes, the thicknesses or heights of the dielectric at those regions differ significantly. That is, the distances from the metallization layer to the top surface of the structure are substantially different at the field oxide region and at the diffusion region during etching of the vias. In order to properly etch the thicker regions, the less thick regions are generally overetched. In addition, a problem of undesirable sidewalls, particularly the sidewalls of a second metallization layer, and re-entrant cusps are formed during the process.

SUMMARY

An object of this invention is to provide an improved process for forming vias in a silicon wafer.

Another object of this invention is to provide a planarized wafer to afford suitable upper surface referencing for etching vias.

In accordance with this invention, a process of forming vias in a silicon wafer comprises the steps of depositing at least one dielectric layer extending over the field oxide region and the diffusion region. A pillar is formed having a thickness of height such that the top surface of the dielectric material at the diffusion region is substantially at the same level as the top surface of the etched dielectric at the field oxide region. The deposition of the dielectric material is achieved prior to deposition of the metallization layer. By this method, the distances or depths for etching vias from the top surface of the structure to the metallization layer at the field oxide region and at the diffusion region are substantially the same.

BRIEF DESCRIPTION OF THE DRAWINGS

The invention will be described in greater detail with reference to the drawings in which.

Similar numerals refer to similar elements throughout the drawing.

DESCRIPTION OF THE PREFERRED EMBODIMENT

Figure 1A:
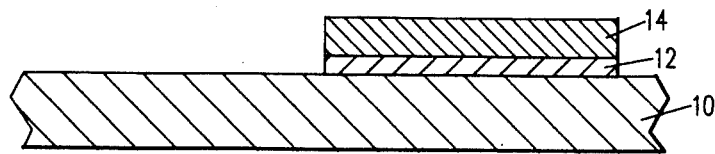
FIGS. 1A-1F are illustrations of the process steps used in forming a planarized silicon wafer, in accordance with the prior art.
Figure 1B:
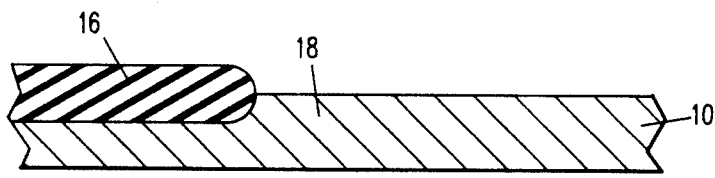
Figure 1C:
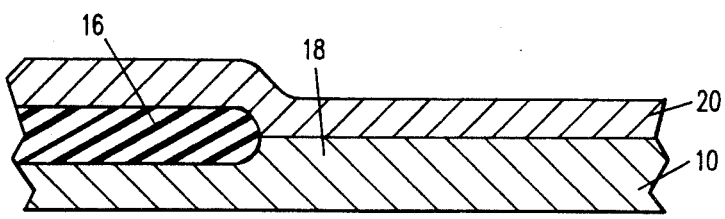

A typical prior art process is represented in Figs. 1A-1F showing the development of a significant difference in height or depth of the dielectric layers at the via locations. In FIG. 1A, a thin film 12 of silicon dioxide is deposited on a semiconductive silicon substrate or wafer 10 followed by a silicon nitride layer 14 utilizing an isolation mask. In this embodiment, the silicon dioxide film 12 is about 500 Å in thickness and the silicon nitride layer 14 is about 1200 Å thick by way of example. The silicon nitride is etched and the wafer is subjected to field oxidation so that a field oxide region 16 of silicon dioxide having a thickness in the range of about 8000 Å-10000 Å is formed, as depicted in FIG. 1B. A layer of polysilicon of about 3500 Å is deposited and patterned so that a diffusion region 18 is formed adjacent to the field oxide region 16 in the silicon wafer. As shown in FIG. 1C, a boron-phosphorous glass (BPSG) 20 is then deposited at a relatively high temperature of 900°-1000° C. so that the glass is liquified and flows to provide a glass layer of about 8000-10000 Å having a relatively smooth surface.

Figure 1D:
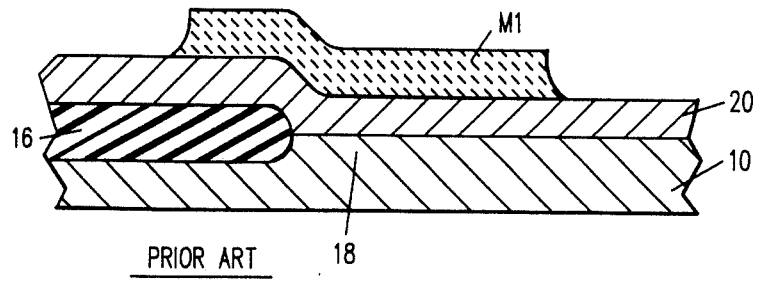
Figure 1E:
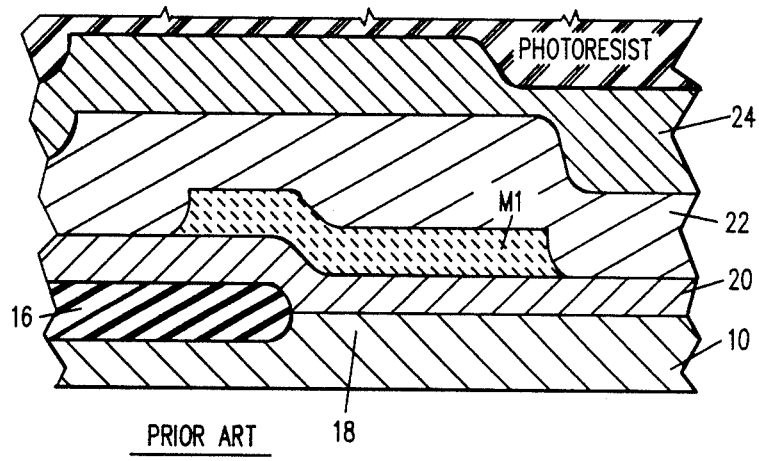
Figure 1F:
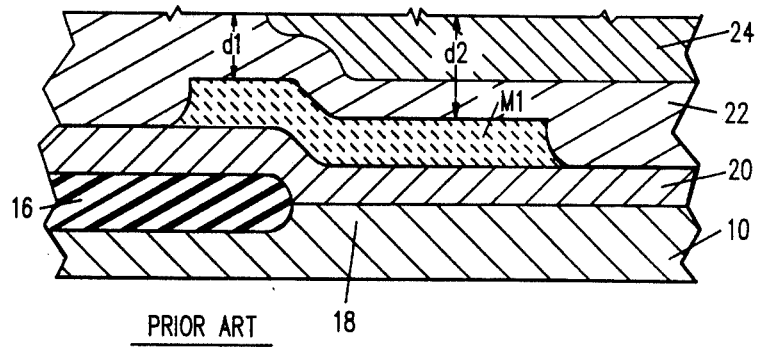

As generally followed in the prior art and as illustrated in FIG. 1D, a first metallization layer M1 of about 7000 Å is deposited and etched to provide electrically conductive contacts for connection to external electrical leads and circuitry. The M1 layer is configured to be superimposed over both the field oxide region 16 and the diffusion region 18. After the metal layer M1 has been formed, a low temperature oxide layer (LTO) 22 of silicon dioxide is deposited over the M1 layer, as illustrated in FIG. 1E, by plasma discharge at low temperature and low pressure. For example, the temperature may be about 500°+50° C., and the pressure may be in the range of 1-25 Torr. The LTO layer 22 is followed by an overcoat 24 of plasma deposited silicon nitride which serves to decrease surface variations. Approximately 3000 Å of surface roughness can be suppressed for every micron of silicon nitride that is deposited, so that the nitride layer 24 becomes substantially planar. Thereafter, a resist coating is applied by flowing photoresist on top of the nitride layer and etching the photoresist to obtain a substantially flat topography. The planarization achieved by this conventional process provides a structure having a top surface that is at a smaller distance d1 from the metallization layer M1 above the field oxide region than the distance of d2 between the top surface and the metallization layer about the diffusion region, as delineated in FIG. 1F. This height difference, which may be on the order of 4000-7000 Å, causes via etching problems, such as overetching, and results in poor coverage of sidewalls of the subsequent metallization layers.

In accordance with this invention and as illustrated in FIGS. 2A-E, a silicon oxide layer 26 is deposited by chemical vapor deposition prior to the deposition of a metallization layer. The layer 26 extends over the field oxide region 16 and the diffusion region 18. A second silicon dioxide layer 28 is then deposited by chemical vapor deposition across the first oxide layer 26 (or one thicker layer 26+28). Alternatively, the dielectric layers 26 and 28 may be formed of boron-phosphorous glass (BPSG) and plasma deposited silicon nitride, respectively. If the layers 26 and 28 are made of different materials, then the etching can be controlled by emission spectroscopy, mass spectrometry or end point monitoring devices to a distance of 100 Å or a small multiple thereof, so that the etching can be halted at a specified end point.

Figure 2A:
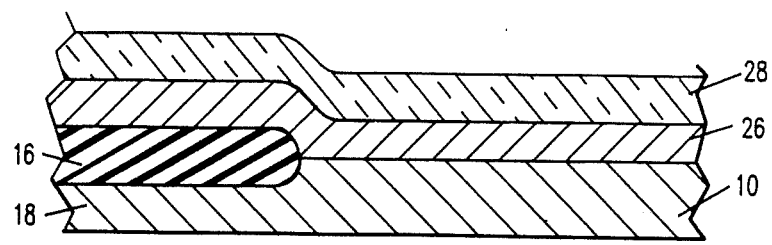
FIGS. 2A-2E are illustrations representing the process steps employed in forming a planarized silicon wafer, in accordance with the present invention.
Figure 2B:
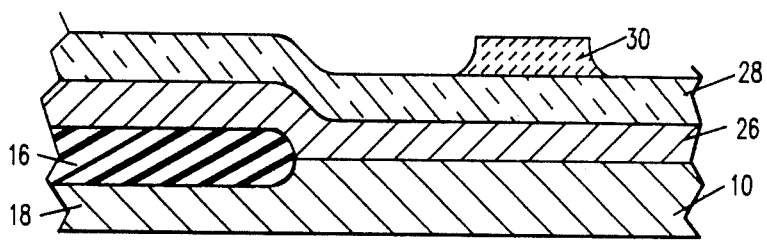
Figure 2C:
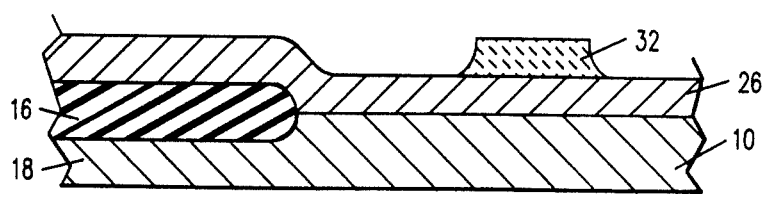
Figure 2D:
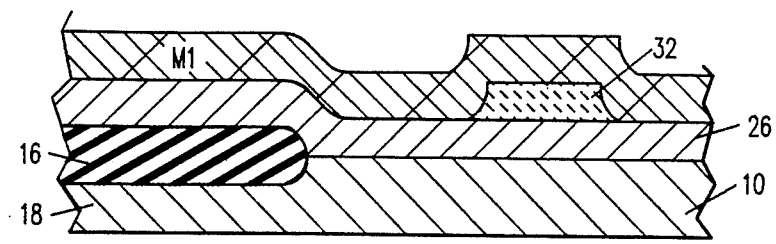
Figure 2E:
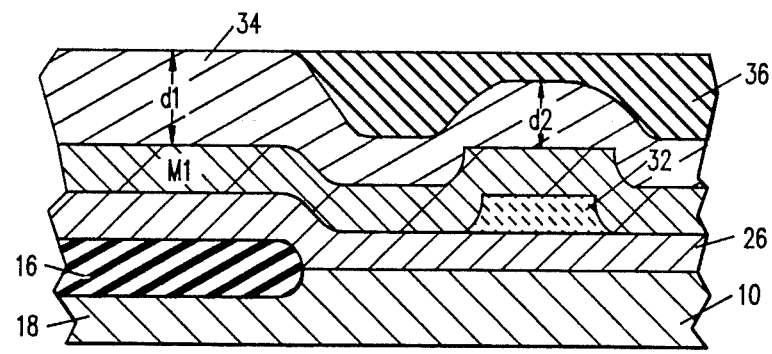

After the deposition of the layers 26 and 28, a photoresist layer 30 is deposited and configured above the via location of the diffusion region 18 as represented in FIG. 2B. The chemical vapor deposited layer 28 is etched back at the area of the photoresist 30 to form a pillar configuration. The top surface of the configured pillar 32 is substantially at the same level or height as the top surface of the dielectric layer 26, as shown in FIG. 2C. At this point, the metallization layer M1 is deposited over the two dielectric layers 26 and 28, as in FIG. 2D. After etching of the metal layer M1, dielectric and sacrificial layers 34 and 36 are deposited, and the wafer undergoes a planarization etch back thereby forming a substantially smooth top surface which extends across the dielectric layers 34 and 36 as shown in FIG. 2E. Subsequently, the vias are etched at the specified locations in alignment with the field oxide region and the diffusion region defined below the pillar 32. The semiconductor structure is thereafter processed conventionally with the deposition of an overcoat, connections of the electrical leads and packaging, inter alia.

It is apparent that the distances d1 and d2 from the top surface of the dielectric layers 34 and 36 to the metallization layer M1 above the field oxide region 16 and the diffusion region 18 are substantially equal. Therefore, all via etches to the M1 layer penetrate to the same thickness of the dielectric. As a result, control of critical dimensions is realized with a minimization of the possibility of overetching in one via location and underetching in another via location. The semiconductor process disclosed herein allows vias to be more shallow with improved sidewall step coverage of the metallization layer, particularly the second metallization layer. By virtue of the via forming process employing a pillar for leveling the metallization layer at the via locations to be etched, process control is significantly improved with resultant improvement in reliability and die yields. In addition, open circuit problems are effectively reduced. With the semiconductor process of this invention, standard semiconductor technology is utilized and no new materials are required.

What is claimed is:

1. A process for forming vias in a silicon wafer comprising the steps of:
    forming a field oxide region on a substrate;
    forming a diffusion region adjacent to said field oxide region on said substrate wherein said field oxide region is at a height different from said diffusion region;
    depositing dielectric material extending over said oxide and diffusion regions;
    configuring a pillar from a portion of said dielectric material at a first via location so that the top surface of said pillar is substantially at the same height as the top surface of said dielectric material at a second via location and a layer of said dielectric material remains over said field oxide and diffusion regions;
    depositing a metallization layer over said dielectric material including said pillar;
    coating said metallization layer with a planarized dielectric; and
    etching vias at said first and second locations.

2. A process for forming vias in a silicon wafer as in claim 1, wherein said first via location is above said diffusion region and said second via location is above said field oxide region.

3. A process for forming vias in a silicon wafer as in claim 1, wherein said deposited dielectric material comprises separate layers of different materials.

4. A process for forming vias in a silicon wafer as in claim 3, wherein said different materials comprise a layer of silicon dioxide and a layer of silicon nitride.

5. A process for forming vias in a silicon wafer as in claim 4, wherein said silicon dioxide is about 500 Å thick and said silicon nitride is about 1200 Å thick.

6. A process for forming vias in a silicon wafer as in claim 1, wherein said dielectric material comprises two layers of silicon dioxide, each having a different doping concentration.

7. A process for forming vias in a silicon wafer as in claim 1, wherein said dielectric material is a glass doped with boron and phosphorous.

* * * * *

UNITED STATES PATENT AND TRADEMARK OFFICE
CERTIFICATE OF CORRECTION

PATENT NO. : 4,708,770

DATED : 11/24/87

INVENTOR(S) : Pasch, Nicholas F.

It is certified that error appears in the above-identified patent and that said Letters Patent is hereby corrected as shown below:

Col. 1, line 16, "smooting" should read --smoothing--.

Col. 1, line 48, "thickness of height" should read --thickness or height--.

Col. 2, line 36, 500° + 50°C. should read --500° $\pm$ 50°C.--.

Col. 2, line 50, delete "of".

Col. 2, line 51, "about" should read --above--.

Signed and Sealed this

Tenth Day of January, 1989

Attest:

DONALD J. QUIGG

Attesting Officer

Commissioner of Patents and Trademarks